(12) United States Patent
Couillard et al.

(10) Patent No.: US 6,430,464 B1
(45) Date of Patent: Aug. 6, 2002

(54) STEPPER ALIGNMENT PROCESS

(75) Inventors: Edmund M. Couillard, Essex Junction; Jonathan F. Dajnowicz, Jericho; Peter J. Sullivan, Fairfield, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/265,020

(22) Filed: Mar. 9, 1999

(51) Int. Cl.⁷ ............................................... G06F 19/00
(52) U.S. Cl. ..................... 700/192; 700/193; 430/22; 430/30
(58) Field of Search .................. 700/192, 193; 430/30, 22; 702/108

(56) References Cited

U.S. PATENT DOCUMENTS

| | | | |
|---|---|---|---|
| 5,402,224 A | * | 3/1995 | Hirukawa et al. .......... 356/124 |
| 5,434,026 A | * | 7/1995 | Takatsu et al. .............. 430/30 |
| 5,437,948 A | * | 8/1995 | Minghetti et al. ........... 430/30 |
| 5,525,808 A | * | 6/1996 | Irie et al. .................... 250/548 |
| 5,674,651 A | * | 10/1997 | Nishi ........................... 430/22 |
| 5,952,135 A | * | 9/1999 | Ghandehari et al. ......... 430/22 |
| 5,989,764 A | * | 11/1999 | Adams ........................ 430/30 |
| 6,278,957 B1 | * | 8/2001 | Yasuda et al. .............. 702/150 |

* cited by examiner

*Primary Examiner*—Thomas Black
*Assistant Examiner*—Ronald D Hartman, Jr.
(74) *Attorney, Agent, or Firm*—Connolly Bove Lodge & Hutz, LLP; Anthony Canale

(57) ABSTRACT

A method of diagnosing alignment of a photolithography tool. A broad band source test is provided. A disturbing sequence is run that is not a portion of the broad band source test. The broad band source test is performed and post disturb test data recorded. A result of the broad band source test is compared with a tolerance. If in the comparison, the result of the broad band source test is not within the tolerance, the photolithography tool is mechanically adjusted.

21 Claims, 2 Drawing Sheets

STEPPER ALIGNMENT PROCESS

FIELD OF THE INVENTION

The invention relates to the field of semiconductor device manufacture. In particular, the invention relates to processes for ensuring alignment of devices utilized in semiconductor device manufacture.

BACKGROUND OF THE INVENTION

Devices used in exposure of photosensitive materials during processes involved in semiconductor device manufacture typically require very precise alignment to ensure proper exposure and subsequent alignment of features formed on a semiconductor substrate. Alignment of is photolithographic tools increases in importance as feature sizes decrease and feature densities increase. Misalignment of photolithography tools can result in high rework levels and low yielding product.

Photolithography tool alignment systems may be monitored with a variety of monitoring schemes. For example, alignment repeatability tests, such as field image alignment (FIA), laser scan alignment (LSA), and laser interferometer alignment (LIA), may routinely be run as diagnostics. These processes involve directly and indirectly detecting positions of a support stage for supporting a semiconductor substrate relative to the exposure optics or illumination source. The test may detect the position of one or more fiducial marks on a support stage, on a test element to be supported by the support as a semiconductor substrate would be supported, or on the semiconductor substrate itself.

SUMMARY OF THE INVENTION

Often, during periods of high misalignment, the diagnostic processes described above may not indicate a problem. The inventors have determined that when a stage problem exists, intermittent misalignment may occur and the above-described diagnostic tests may not be effective as typically carried out.

The present invention solves this and other problems by providing a method of diagnosing alignment of a photolithography tool. According to the method, a broad band source test is provided. A disturbing sequence is run that is not a portion of the broad band source test. The broad band source test is performed. Post disturbed test data is recorded. A result of the performance of the broad band source test is compared with a tolerance. If the result is not within the tolerance, the photolithography tool is mechanically adjusted.

The present invention also provides a method of diagnosing alignment of a photolithography tool. The method includes performing a broad band source test and recording first test data. A disturbing sequence is run that is not a portion of the test. A second broad band source test is performed and second test data recorded. The result of the second broad band source test is compared with the results of the first broad band source test. If the results of the second broad band source test is not within a tolerance of the results of the first broad band source test, the use of the photolithography tool is stopped and the tool is mechanically adjusted.

Furthermore, the present invention provides a method of diagnosing alignment of a photolithography tool. The method includes performing a first alignment test to determine alignment of the photolithography tool. A second alignment test is performed to determine alignment of the photolithography tool. Test data are recorded from the second alignment test. The test data are compared with a tolerance value. The photolithography tool is mechanically adjusted if the test data is not within the tolerance value range.

Additionally, the present invention provides an article of manufacture that includes a computer usable medium having computer readable program code embodied therein for diagnosing alignment of a photolithography tool. The computer readable program code in the article of manufacture includes computer readable code for causing a computer to run a disturbing sequence. Additionally, the computer readable program code includes computer readable code for causing a computer to perform a broad band source test and record post disturb test data. Also, computer readable code is included for causing a computer to compare a result of broad band source test with a tolerance. Furthermore, computer readable code is included for causing a computer to cause the mechanical adjustment of the photolithography tool if the result of the comparison is not within the tolerance.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

BRIEF DESCRIPTION OF THE DRAWINGS

The above-mentioned objects and advantages of the present invention will be more clearly understood when considered in conjunction with the accompanying drawings, in which:

FIG. 1a represents a perspective view of a ball lead screw portion of an example of a photolithography tool that the present invention may be utilized with;

FIG. 1b represents a perspective view of the ball lead screw portion illustrated in FIG. 1a, attached to a stage of the photolithography tool; and FIG. 2 represents a perspective view of an embodiment of a photolithography tool that the present invention may be utilized with.

DETAILED DESCRIPTION OF THE INVENTION

Figures 1A, 1B:
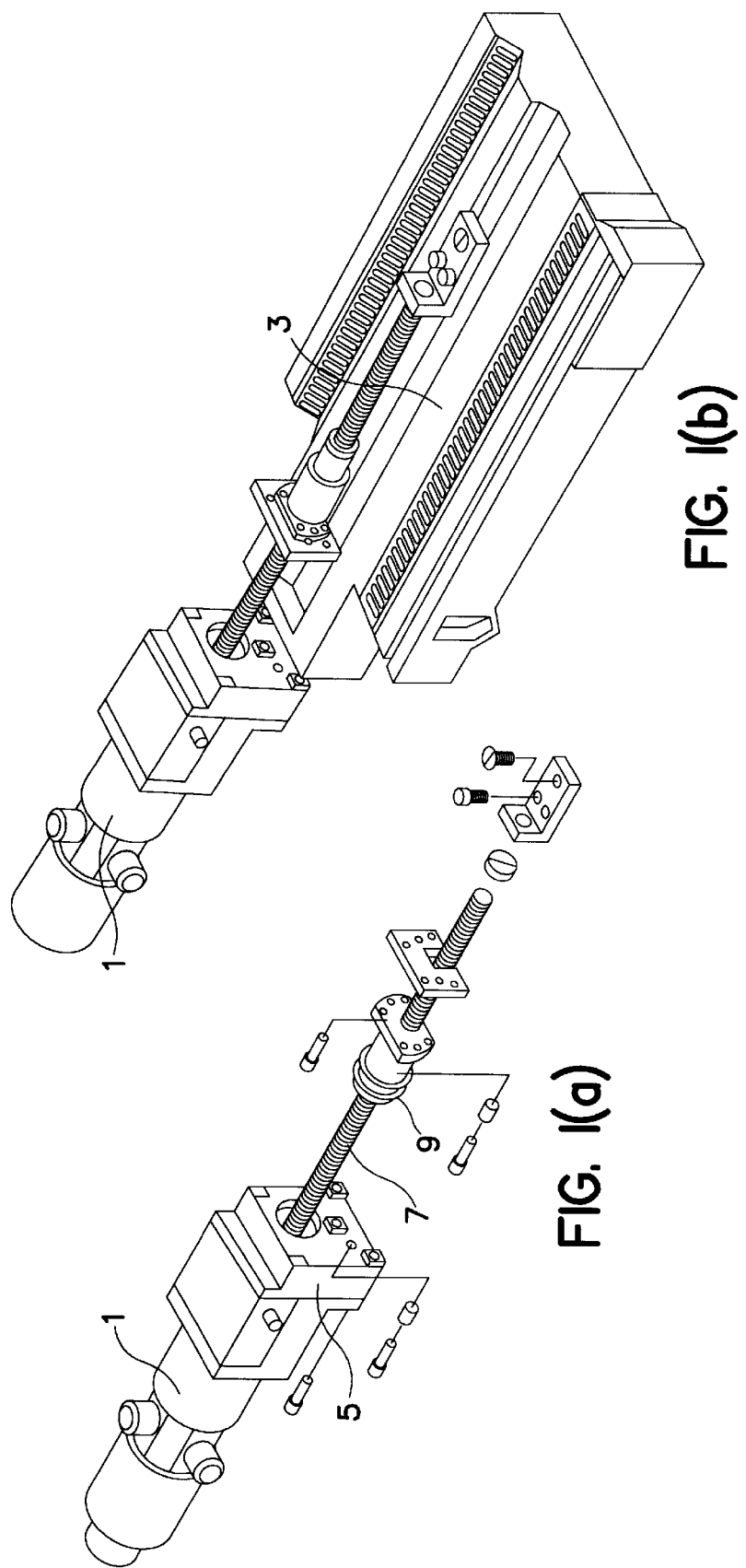

FIG. 1a illustrates a portion of an example of a photolithography tool that the present invention may be utilized with. FIG. 1a illustrates one of two ball lead screw portions of the device including a lead screw motor 1 that will drive wafer stage in the X and Y direction along the screw in the photolithography tool. Connected to the motor may be a thrust bearing 5, a lead screw 7 and a backlash nut 9. FIG. 1b illustrates the ball lead screw portion shown in FIG. 1a attached to a stage portion 3. FIGS. 1a and 1b were taken from the Nikon Stage Applications Class 5/98, Page 11.

Figure 2:
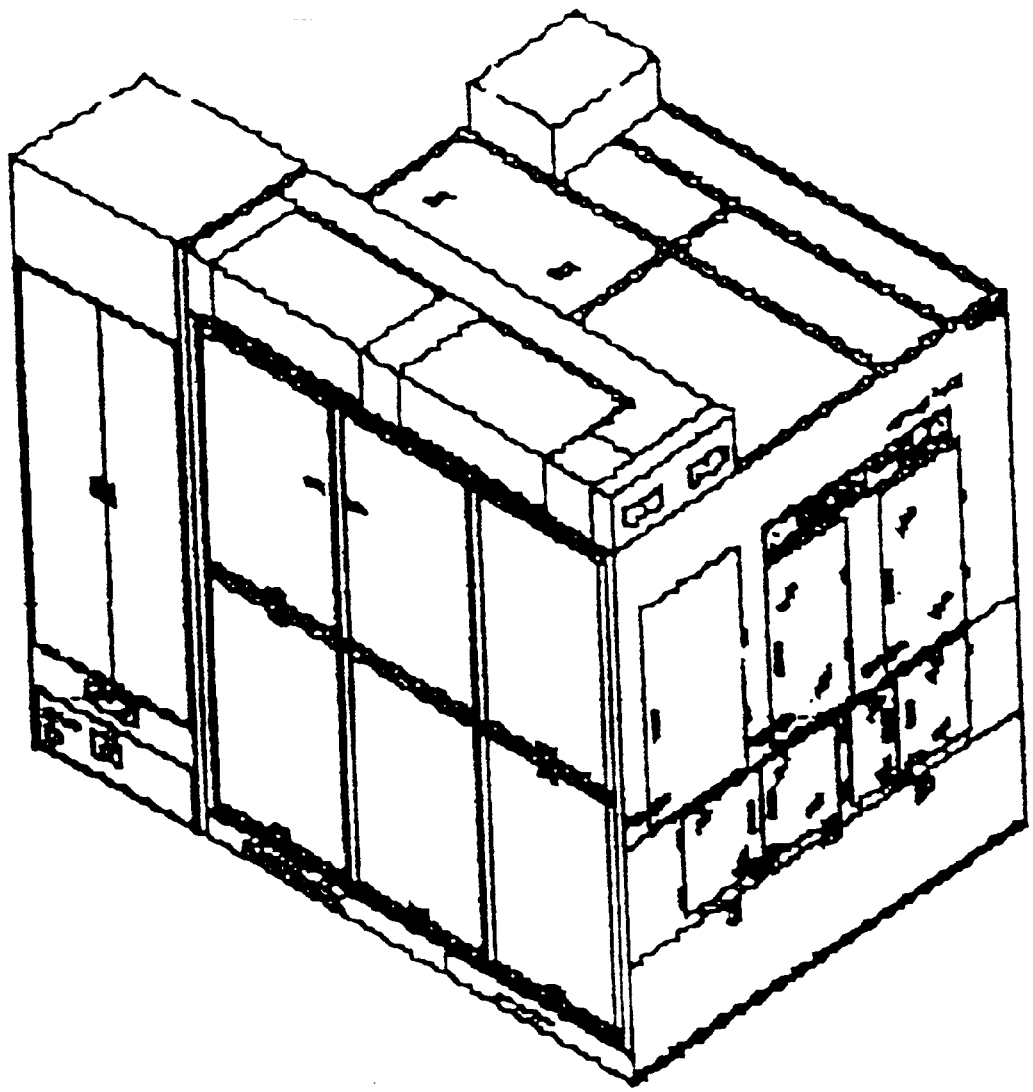

Two examples of photolithography tools that the present invention may be utilized with are the i11B and the i12B tools available from Nikon. FIG. 2, which was taken from the Nikon Step-and-Repeat System, NSR-2005i9 Series Advanced Applications Manual, Page 1-1 (1993), illustrates a perspective view of a Nikon photolithography tool with a lead screw stage.

A photolithography tool such as that illustrated in FIG. 2 and those-referred to above may be utilized, for example, in producing 0.35 μm product utilizing i line 365 nm radiation. Typically, alignment marks are provided in the kerf of every chip from the first level. Typically, these tools were aligned to a statistical sample of eight kerf alignment marks.

As discussed above, FIA, LSA, and LIA may be individually used to determine alignment of photolithography tools. Typically, photolithographic tools, such as those referred to above and illustrated in FIG. 2, include a fixed fiducial on the stage that supports semiconductor substrate. Typically, optics are first aligned to the fiducial on the stage, which acts as a reference. This alignment may be carried out typically utilizing LSA, FIA, or LIA.

According to the FIA tests, which is a static mode test, a CCD camera scanned the stage or elements arranged on a stage, such as a wafer, or a blank including fiducial marks. The CCD camera acquires the mark. The actual location of the mark minus the expected location of the mark is then determined. The test may be carried out repeatedly and the results then statistically analyzed. Typically, FIA is carried out off axis.

An FIA alignment system typically includes a halogen light that produces a broad band of wave lengths, whether visible or not. The light produced typically does not travel through the reduction optics. In an FIA test, a semiconductor substrate, or wafer, may be moved under the FIA camera and then placed back under projection optics for exposure purposes.

Unlike the FIA test, the LSA test is a dynamic test. Also, unlike LSA, FIA typically is carried out off axis. According to the LSA, monochromatic laser light is directed toward the stage. A wafer, glass dummy may be arranged on the stage. The laser diffracts off the target. The diffracted light is detected and the results analyzed to determine alignment of the stage.

In an LSA alignment system, a laser beam does not necessarily need to travel through the reticle. The laser may be reflected down through the reduction optics. The laser may be aligned to the fiducial during base line set up and later during wafer alignment, to the wafer. The reticle may also be aligned to the fiducial.

According to the LIA test, the laser beam is split into two beams prior to being directed at the stage. The light reflected off the stage is analyzed by an interferometer.

The LSA and LIA tests may be referred to herein as a disturbing sequence. The tests are disturbing in the sense that the stage and/or laser source are moved during the tests.

While FIA, LSA, and LIA may be individually used to determine alignment of photolithography tools, the inventors of the present invention have determined that these processes may not detect misalignment of photolithography tools in a number of cases. The inventors of the present invention have unexpectedly discovered that performing certain of the tests in certain sequences can result in detection of misalignment that would otherwise go undetected. For example, the inventors of the present invention observed misalignment only the first time normal diagnostic procedures were run and after every LSA test. If FIA fiducial repeatability was run, the repeatability was out of spec, driven by the first measurement.

When operating these tools, alignment problems have been experienced to cause 25% rework after photoresist development. Typically, two or three wafers out of a lot of 25 were measured. The rework decision was made if alignment was one quarter of a line width or about 90 nm.

As a result of shortcomings of the FIA, LSA, and other tests as well as the method for utilizing these tests to measure alignment, normal diagnostic practices did not indicate a problem with alignment of the photolithography tools. However, as described above, alignment problems resulting in a high degree of rework.

For repeated FIA tests, the stage of the tool does not move. However, to perform an LSA test immediately following the FIA test, the stage must move to acquire the LSA target. It was discovered that if the stage is just moved rather than performing the LSA step, the tool would be in alignment. Also, if FIA fiducial repeatability was run immediately after the first step in the FIA test, then repeatability was discovered to be within the specified values and the first measurement was normal. Subsequent runs of FIA repeatability were found to be normal.

However, if after running FIA fiducial repeatability immediately after step 1, LSA repeatability tests were carried out, then FIA repeatability was again carried out, the FIA repeatability was out of spec driven by the first measurement.

The present invention was developed to ensure alignment of photolithography tools in all situations.

According to the present invention, a broad band source test, such as the FIA test described above may be provided. A disturbing sequence that is not a portion of the broad band source test may be performed. As discussed above, the disturbing sequence could include the LSA and/or LIA tests.

After running the disturbing sequence, the broad band source test may be performed. Data resulting from the test may be recorded. The data are then compared with a tolerance value and/or distribution of values. If the results of the comparison are not within the tolerance, the photolithography tool may be mechanically adjusted.

According to some embodiments, a broad band source test may be performed prior to running the disturbing sequence. According to such embodiments, the results of the first performance of the first broad band source test may be recorded as first test data. After first performing the broad band source test, the disturbing sequence may be performed. Then, the broad band source test may be performed for a second time. Unlike embodiments where the post disturbed test data are compared with the tolerance, in embodiments where the broad band source test is first performed prior to the disturbing sequence, the post disturbed test data may be compared with the first test data resulting from the first performance of the broad band source test.

As stated above, one example of a broad band source test is the FIA test, typically, the FIA is repeatedly performed and the mean and standard deviation determined. The analysis of the FIA tests, whether comparing them to a tolerance or to another test session, may be carried out utilizing a variety of statistical analysis. According to the present invention, one statistical analysis that has been found to be particularly useful is the Tukey distribution. The Tukey Method is described below. Material describing the Tukey distribution was taken from and additional information may be found in J. DeVore, "Probability and Statistics", Wadsworth Publishing Company, (1995), the entire contents of the disclosure of which is hereby incorporated by reference. In particular, see pages 402 and 427.

According to the Tukey distribution, the grand average of the FIA tests may be calculated. The FIA results may be determined and recorded in both the X direction and the Y direction. According to one embodiment, the FIA is carried out ten times. According to another embodiment, the FIA is carried out twenty times. After calculating the grand average of fiducial repeatabilities for X and Y for every tool, the standard deviation of the grand average may be determined.

After calculating the grand average and the standard deviation, the mean square error (MSE) of the population of tools may be determined. The MSE may be determined according to the following formula:

$$MSE=[s^2(1)+s^2(2)+\ldots+s^2(n)]/n,$$

where $s^2(1)$ represents the variance of the grand average of tool 1; and n represents the number of tools.

Next, the Tukey range (w) for a 95% confidence level ($\alpha$) may be determined according to the following formula:

$$w=Q_{\alpha,I,I(J-1)}\sqrt{(MSE/J)},$$

where $Q_{\alpha,I,I(J-1)}$ represents the critical value studentized range distribution, determined from a standard student table, I represents the number of treatments or number of tools of the population, and J represents the number of trials per treatment.

Based on the Tukey range, w, it may be determined into which distribution a certain tool's fiducial repeatability will fall. The best tool with the lowest grand average of FIA fiducial repeatability will be designated the "A" tool. One standard deviation away from the "A" tool will be the "B" tool and so on.

Below represents a Tukey distribution for a plurality of Nikon i11B and i12B tools. In this case, the Tukey distribution, W, was 0.0034 $\mu$m.

| Tool | Mean Rep.X(3s) | Std X | Distribution |
|---|---|---|---|
| 428X | 0.0117 $\mu$m | 0.000943 $\mu$m | A |
| 478X | 0.0126 $\mu$m | 0.000600 $\mu$m | A |
| 424X | 0.0136 $\mu$m | 0.001166 $\mu$m | A |
| 429X | 0.0141 $\mu$m | 0.001055 $\mu$m | AB |
| 468X | 0.0168 $\mu$m | 0.001019 $\mu$m | AB |
| 477X | 0.0183 $\mu$m | 0.000994 $\mu$m | B |
| 426X | 0.0261 $\mu$m | 0.006198 $\mu$m | D |

Below are data for two different tools before and after stage adjustment. Before stage adjustment, rework on the two tools was greater than 25%, whereas after adjustment, rework was reduced to about 10% on one tool and about 80% on the second tool. On the first tool, prior to adjustment.
Fiducial repeatability X before Adj. (3s)=0.082 $\mu$m
Distribution before adjustment=T
Fiducial repeatability X after Adj. (3s)=0.0168 $\mu$m
Distribution before adjustment=B+
For the second tool,
Fiducial repeatability X before Adj. (3s)=0.047 $\mu$m
Distribution before adjustment=J
Fiducial repeatability X after Adj. (3s)=0.0183 $\mu$m
Distribution before adjustment=B The following data represents lots of product treatment and error value before and after adjustment:

| # Lots | X Interval (nm) | Y Interval (nm) |
|---|---|---|
| 30 | 64 | 59.1 |
| 17 | 44 | 43.2 |

Based upon the above values, it was determined that X improved and Y both improved with a confidence level of 99.9%.

Below represents data before and after adjustment of a third tool:

| Lots | X Int | X int, 3 sigma | Y Int | Y int., 3 sigma | Reworked |
|---|---|---|---|---|---|
| 20 | 79 nm | 60 nm | 59 nm | 46 nm | 6 |

The following represents data on the same tool after adjustment:

| Lots | X Int | X int, 3 sigma | Y Int | Y int, 3 sigma | Reworked |
|---|---|---|---|---|---|
| 8 | 72 nm | 23.9 nm | 69 | 62 | 0 |

The following represent fiducial repeatability before and after the stage adjustment for the above tool:
Fiducial repeatability X before Adj. (3s)=0.115 $\mu$m
Distribution before adjustment=worse then Z
Fiducial repeatability X after Adj. (3s)=0.147 $\mu$m
Distribution before adjustment=A The following represent fiducial repeatability before and after a stage adjustment of yet another photolithography tool:
Fiducial repeatability X before Adj. (3s)=0.0483 $\mu$m
Distribution before adjustment=I
Fiducial repeatability X after Adj. (3s)=0.008 $\mu$m
Distribution after adjustment=A The following data represent trials carried out before thrust adjustment:

| Lots | X Int | X int, 3 sigma | Y Int | Y int, 3 sigma |
|---|---|---|---|---|
| 23 | 105 nm | 108 nm | 98 nm | 121 nm |

The following represent data after thrust adjustment:

| Lots | X Int | X int, 3 sigma | Y Int | Y int, 3 sigma |
|---|---|---|---|---|
| 63 | 88 nm | 78 nm | 82 | 79 |

After carrying out the process according to the present invention, when misalignment is detected, a photolithography tool may be adjusted. The adjustment can include one or more of a plurality of parameters with respect to the tool. For example, a torque of a thrust nut could be adjusted. The thrust nut can control a thrust bearing can control a lead screw. However, these are just representative examples of parameters that may need to be adjusted. Those skilled in the art would know what parameters could be adjusted to correct alignment or misalignment of the photolithography tool.

The present invention also includes software that implements the above process. One skilled in the art would be able to create a program to carry out the above method once aware of the disclosure contained herein. The following that the present invention can include a computer useable medium having a computer readable program embodied therein. The computer readable program code in the article manufacture can include computer readable program code for causing a computer to perform the above-described process.

By ensuring the alignment of photolithography tools, their useful lives may be extended beyond the originally designed specifications. For example, a product designed for 100 nm features may be pushed to 70 nm.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

We claim:

1. A method of diagnosing alignment of a photolithography tool, comprising:
    a) performing a first broad band source test;
    b) running a disturbing sequence that is not a portion of the first broad band source test;
    c) performing a second broad band source test and recording post disturb test data;
    d) comparing a result of step (c) with a tolerance; and
    e) wherein if in step (d) the result of step (c) is not within the tolerance, mechanically adjusting the photolithography tool.

2. The method according to claim 1, wherein the fist broad band source test is first performed prior to running the disturbing sequence and results of the first performance of the first broad band source test recorded as first test data, and wherein in step (d) the post disturb test data is compared with the first test data to determine if the post disturb test data are within a tolerance of the first test data.

3. A method of diagnosing alignment of a photolithography tool, comprising the steps of:
    a) performing a first broad band source test and recording first test data;
    b) running a disturbing sequence that is not a portion of the first test;
    c) performing a second broad band source test and recording second test data;
    d) comparing a result of step (c) with step (a);
    e) wherein if in step (d) the result of step (c) is not within a tolerance of step (a) then stopping use of the photolithography tool and mechanically adjusting the photolithography tool.

4. The method according to claim 3, wherein step (a) includes repeating the broad band source test and recording a distribution of data.

5. The method according to claim 4, wherein step (d) includes comparing the result of step (c) with the distribution.

6. The method according to claim 5, wherein in step (e) the tolerance is a parameter of the distribution.

7. The method according to claim 4, wherein step (a) includes repeating the broad band test at least 10 times.

8. The method according to claim 4, wherein step (a) includes repeating the broad band test at least 20 times.

9. The method according to claim 3, wherein in step (c) the second test is a repetition of the first test.

10. The method according to claim 3, wherein in step (a) the broad band source test is a field image alignment test.

11. The method according to claim 3, wherein in step (b) the disturbing sequence is a disturbing test.

12. The method according to claim 11, wherein in the disturbing test is a laser scan alignment test or a laser interferometer alignment test.

13. The method according to claim 3, wherein in step (d) the comparing includes a Tukey distribution.

14. The method according to claim 3, wherein step (e) includes adjustment of a torque of a thrust nut.

15. The method according to claim 14, wherein the thrust nut controls a thrust bearing.

16. The method according to claim 15, wherein the thrust bearing controls a lead screw.

17. The method according to claim 3, wherein in step (c) the broad band source test is a field image alignment test.

18. A method of diagnosing alignment of a photolithography tool, comprising:
    performing a first alignment test to determine alignment of the photolithography tool;
    performing a second alignment Lest to determine alignment of the photolithography tool;
    performing a third alignment test to determine alignment of the photolithography tool;
    recording test data from the third alignment test;
    comparing the test data With a tolerance value range; and
    mechanically adjusting the photolithography tool if the test data is not within the tolerance value range.

19. The method according to claim 18, wherein the first and third alignment tests utilize a broad band of wavelengths of electromagnetic radiation.

20. The method according to claim 18, wherein the second alignment test utilizes monochromatic electromagnetic radiation.

21. An article of manufacture, comprising:
    a computer usable medium having computer readable program code embodied herein for diagnosing alignment of a photolithography tool, the computer readable program code in the article of manufacture comprising:
    computer readable code for causing a computer to perform a first broad band source test;
    computer readable code for causing a computer to run a disturbing sequence;
    computer readable code for causing a computer to perform a second broad band source test and record post disturb test data;
    computer readable code for causing a computer to compare a result of the second broad band source test with a tolerance; and
    computer readable code for causing a computer to cause the mechanical adjustment of the photolithography tool if the result of the comparison is not within the tolerance.

* * * * *